United States Patent
Black et al.

(10) Patent No.: US 9,570,321 B1
(45) Date of Patent: Feb. 14, 2017

(54) USE OF AN EXTERNAL GETTER TO REDUCE PACKAGE PRESSURE

(71) Applicant: RAYTHEON COMPANY, Waltham, MA (US)

(72) Inventors: Stephen H. Black, Tennessee Ridge, TN (US); Adam M. Kennedy, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/887,544

(22) Filed: Oct. 20, 2015

(51) Int. Cl.
  *H01L 21/322* (2006.01)
  *H01L 23/26* (2006.01)
  *H01L 23/544* (2006.01)

(52) U.S. Cl.
  CPC ........... *H01L 21/3225* (2013.01); *H01L 23/26* (2013.01); *H01L 23/544* (2013.01); *H01L 2223/54426* (2013.01)

(58) Field of Classification Search
  CPC ........... H01L 31/0203; H01L 23/49866; H01L 21/76841; H01L 21/52; H01L 23/10; H01L 23/26; H01L 2924/1461; H01L 27/14618; H01L 51/5259; B81C 1/00269; B81B 7/0038
  See application file for complete search history.

(56) References Cited

U.S. PATENT DOCUMENTS

| | | | |
|---|---|---|---|
| 5,895,233 A | 4/1999 | Higashi et al. | |
| 5,921,461 A | 7/1999 | Kennedy et al. | |
| 6,479,320 B1 | 11/2002 | Gooch | |
| 6,521,477 B1 | 2/2003 | Gooch et al. | |
| 6,856,014 B1 * | 2/2005 | Ehmke | B81C 1/00333 257/704 |
| 6,958,264 B1 | 10/2005 | Lin | |
| 7,723,747 B2 * | 5/2010 | Koo | H01L 51/5237 257/100 |
| 7,952,189 B2 | 5/2011 | Wan | |
| 8,393,526 B2 | 3/2013 | Diep | |
| 8,454,789 B2 | 6/2013 | Diep et al. | |
| 8,608,894 B2 | 12/2013 | Black et al. | |
| 8,736,045 B1 | 5/2014 | Gooch et al. | |
| 8,809,784 B2 | 8/2014 | Gooch et al. | |
| 8,844,793 B2 | 9/2014 | Diep et al. | |
| 8,980,676 B2 | 3/2015 | Diep et al. | |
| 9,022,584 B2 | 5/2015 | Black et al. | |
| 2012/0112334 A1 | 5/2012 | Baillin et al. | |
| 2014/0053966 A1 | 2/2014 | Gooch et al. | |

(Continued)

OTHER PUBLICATIONS

Chidambaram et al. "Titanium Based Getter Solution for Wafer-Level MEMS Vacuum Packaging" Institute of Microelectronics, Journal of Electronic Materils, vol. 12 No. 3, 2013.

(Continued)

*Primary Examiner* — Roy Potter (74) *Attorney, Agent, or Firm* — Lando & Anastasi, LLP (57) ABSTRACT

A system and method for forming a wafer level package. In one example, a substrate used in the wafer level package includes a surface defined by a wafer level package (WLP) region and an external region, and a layer of getter material is disposed on at least a portion of the external region. According to one embodiment, the external region comprises a saw-to-reveal (STR) region of the wafer.

20 Claims, 8 Drawing Sheets

(56) References Cited

U.S. PATENT DOCUMENTS

| | | |
|---|---|---|
| 2014/0124899 A1 | 5/2014 | Gooch et al. |
| 2014/0175590 A1* | 6/2014 | Gooch ................ H01L 31/0203 257/433 |
| 2014/0346643 A1 | 11/2014 | Gooch et al. |
| 2015/0014854 A1* | 1/2015 | Gooch .............. H01L 23/49866 257/751 |
| 2015/0162479 A1 | 6/2015 | Gooch et al. |
| 2015/0249042 A1 | 9/2015 | Gooch et al. |

OTHER PUBLICATIONS

International Search Report and Written Opinion for corresponding PCT Application PCT/US2016/033219 mailed Jul. 18, 2016.

* cited by examiner

USE OF AN EXTERNAL GETTER TO REDUCE PACKAGE PRESSURE

BACKGROUND

A conventional wafer level package (WLP) includes a device wafer having one or more devices disposed on a substrate that is bonded to a cap or lid wafer using bonding structures. The finished WLP forms a hermetically sealed interior to protect the devices and extend their useful life. Getters have historically been used to reduce the pressure within the sealed vacuum cavity of WLP, and to maintain the vacuum over the life of the device. A getter is typically a material that, when activated, captures gas molecules in a vacuum or low pressure environment. The getter absorbs, adsorbs, and/or physically entraps oxygen and other molecules and impurities that are outgassed from the components packaged within the WLP, and in certain instances, may also trap impurities that leak through the WLP from the external environment. The getter is typically made from materials that react with the impurities to form stable compounds, such as oxides, carbides, hydrides, and nitrides.

As die sizes shrink, the amount of space that can be allocated to the getter within the WLP is also reduced. During the wafer bonding process, there is thus an increased potential to contaminate these small getters. There is therefore a need for a method or system that can compensate for this loss in getter size and subsequent increase in the risk of contamination.

SUMMARY

Aspects and embodiments are directed to devices and methods that provide a layer of getter material disposed on at least a portion of an external region of one or both of the wafers comprising a WLP.

According to one embodiment, a wafer for use in forming a wafer level package comprises a substrate having a surface defined by a wafer level package (WLP) region and an external region, and a layer of getter material disposed on at least a portion of the external region of the surface of the substrate.

In one example, the external region comprises a saw-to-reveal (STR) region. In on example, the STR region is defined by a two-dimensional pattern of intersecting horizontal and vertical saw lanes, and the layer of getter material is disposed on at least a portion of at least one of the horizontal and vertical saw lanes. According to a further example, the layer of getter material is disposed on at least a portion of both the horizontal and the vertical saw lanes. According to another example, the STR region is defined by a series of parallel saw lanes. According to one example, the layer of getter material is continuous.

In one example, the substrate is a window cap wafer and at least a portion of the WLP region includes an optically transmissive window material. In another example, the substrate is a device wafer and at least a portion of the WLP region includes at least one semiconductor device. In one example, the layer of getter material is further disposed on at least a portion of the WLP region.

In one example, the getter material comprises at least one of titanium (Ti), zirconium (Zr), ruthenium (Ru), tantalum (Ta), hafnium (Hf), lanthanum (La) and molybdenum (Mo). In one example, the thickness of the layer of getter material is in a range of about 1000 Angstroms to about 10,000 Angstroms.

According to another embodiment, a method for forming a wafer comprises providing a substrate, masking a surface of the substrate with a masking material to at least partially define an external region, wherein at least a portion of the external region is open to the surface of the substrate, and depositing a layer of getter material on the surface of the substrate through the open portion of the external region.

In one example, masking the surface with the masking material at least partially defines a WLP region, wherein at least a portion of the WLP region is open to the surface of the substrate, and the layer of getter material is further deposited on the surface of the substrate through the open portion of the WLP region. In one example, the external region comprises an STR region defined by at least one saw lane. In a further example, depositing forms a continuous layer of getter material.

According to another embodiment, a method for forming a wafer level package comprises providing a window cap wafer and a device wafer, each of the window cap wafer and the device wafer having a surface defined by a WLP region and an external region, wherein a layer of getter material is disposed on at least a portion of the external region of at least one of the window cap wafer and the device wafer, aligning the window cap wafer with the device wafer, and bonding the window cap wafer and the device wafer to each other to form the wafer level package.

In one example, during the bonding at least a portion of one or more impurities present on at least one of the window cap wafer and the device wafer outgas into the layer of getter material. In another example, the layer of getter material reduces pressure in a region between the window cap wafer and the device wafer during the bonding.

In one example the bonding is performed under vacuum and comprises heating the layer of getter material to a temperature such that it is activated during bonding. In a further example, the layer of getter material is heated to a temperature of at least 300° C.

According to another embodiment, a wafer for use in a level package comprises a substrate having a surface defined by a WLP region and an external region, the external region including a plurality of intersecting horizontal and vertical saw lanes, and at least one layer of getter material disposed on at least a portion of each of the WLP region and the external regions of the surface of the substrate.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Aspects and embodiments are directed to wafers for use in a wafer level package (WLP) that include a layer of getter material disposed on at least a portion of an external region of the wafer. As discussed further below, the WLP region includes either the top or the bottom components, i.e., lid and device wafer, of the finished WLP package, and therefore corresponds to the portion of the wafer that is used in the WLP package. As used herein, the term "external region" refers to any region of the wafer that is outside of the sealed region of the WLP. For example, according to some embodiments, the external region may comprise a saw-to-reveal (STR) region of the wafer. The external getter material may also be used in other regions of the wafer besides the saw lanes that are otherwise unused, such as in intersecting regions where the corners of dies meet and that are not otherwise part of the saw lane. Other examples of regions where the external getter may be used are regions outside of "lithographically" or otherwise "printed" or "working" areas in the periphery of the wafer that are blank or have regions that can be covered with a layer of getter material. As discussed further below, any region outside of the WLP interior where getter material may be used as a means for reducing pressure during the package assembly process may be suitable for the external getter material of the subject disclosure.

As mentioned previously, as die sizes shrink, the amount of area within the WLP that can be allocated to a getter also shrinks, which decreases the functional capacity of the getter. However, while die sizes are shrinking, in certain instances the amount of area consumed by saw lanes or other regions that are external to the WLP region on the surface of the wafer are either staying the same size or increasing. By depositing getter material external to the WLP regions of the wafer, a large gettering surface can be added to help compensate for the loss of getter material internal to the WLP. This additional gettering surface is available to reduce pressure between the wafers during the WLP bonding process, and therefore reduces the potential for contaminating any getter material located within the WLP. The extra getter material located in the external region can remove outgassed materials during the bonding process that would normally be absorbed by getter material located within the WLP. This reduces the load on the getter material within the WLP during the bonding process; thereby allowing it to absorb more outgassed material during the life of the packaged device and possibly extending the life of the device. Furthermore, a getter that is applied across the wafer outside the WLP region may be of benefit in removing outgassed elements across the entire wafer and may thus reduce the vacuum pressure for the entire wafer. For instance, by increasing the getter capacity across the wafer, the overall wafer pressure can be reduced which improves pixel response (which is correlated to pressure). An increase in pixel response provides for an increase in sensitivity and thus increases the performance of the sensor.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Figures 1A, 1B:
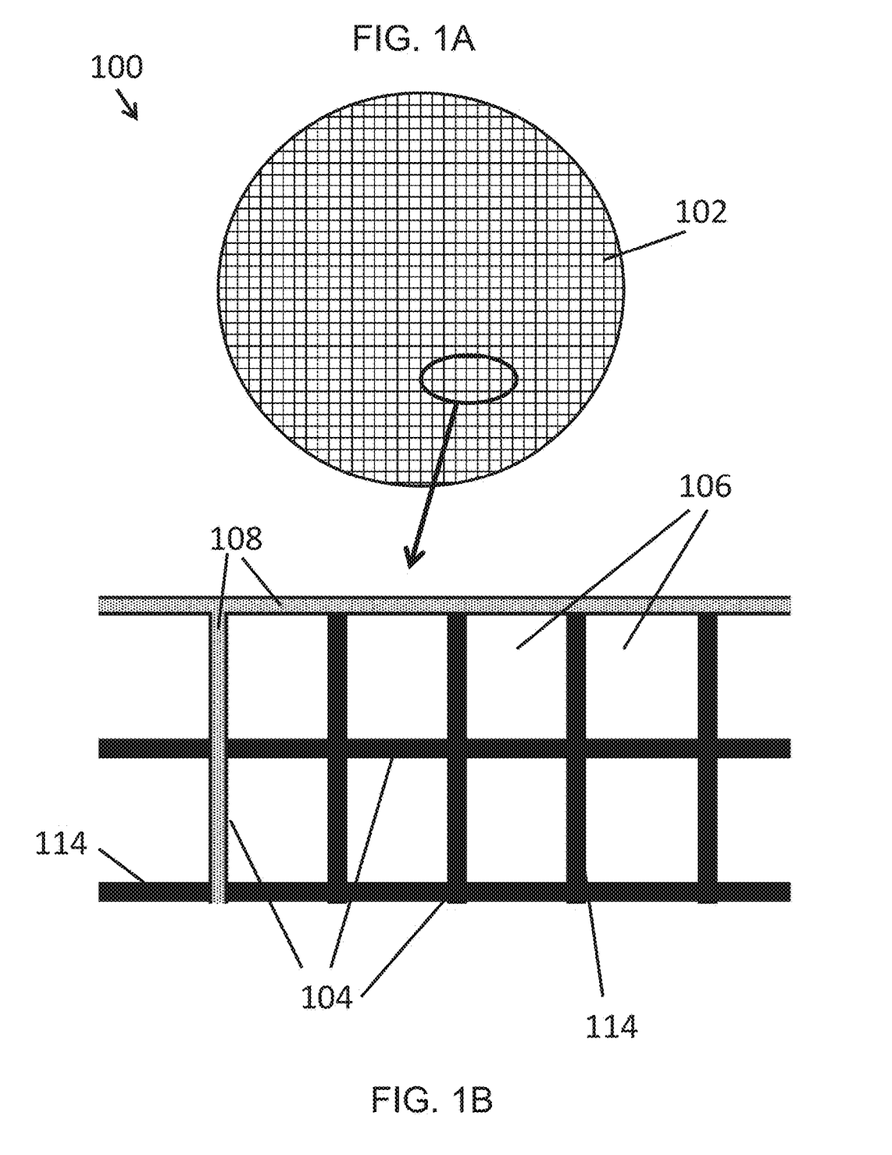
FIGS. 1A and 1B are diagrams illustrating a plan view of a wafer in accordance with one or more aspects of the disclosure.

Referring to the FIG. 1A, a top view of a wafer 100 is shown that has a two-dimensional pattern defined on its surface 102. The patterned surface of the substrate shown in FIG. 1A is a grid pattern, although other patterns are also within the scope of this disclosure. FIG. 1B shows a close-up of the circled portion of the surface 102, where it is more clearly shown that the surface 102 is defined by an external region 104 and a WLP region 106. As discussed in more detail below, the WLP region 106 includes either the top or the bottom components, i.e., lid and device wafer, of the finished WLP package, and therefore corresponds to the portion of the wafer 100 that is used in the WLP package. As shown, the external region 104 is defined as any area outside of the WLP region 106. In this instance, the external region 104 comprises an STR region that is defined by a plurality of intersecting horizontal and vertical saw lanes 114, which may also be referred to as scribe lanes or scribe lines. The saw lanes 114 define the portion of the wafer 100 that are cut or diced to form the individual WLP packages. Each of the horizontal and vertical saw lanes 114 of the embodiment shown in FIGS. 1A and 1B are parallel and equidistant from each other, but other embodiments may include horizontal and/or vertical saw lanes that are not equidistant from each other, such as the embodiment discussed below in reference to FIGS. 3A, 3B, 4A, and 4B. It is to be appreciated that the STR region of the external region 104 may be defined by other patterns or configurations of saw lanes, such as diagonal patterns.

Referring back to FIG. 1B, a layer of getter material 108 is disposed on at least a portion of the external region 104. For example, a layer of getter material 108 may be disposed on at least a portion of one or more of the horizontal and/or vertical saw lanes 114 that form the STR region. The layer of getter material 108 may be continuous, meaning that at least some getter material is disposed continuously across a substantial portion of the width and/or length of the saw lane 114 as it extends across the wafer. For instance, the layer of getter material 108 shown in the horizontal and vertical saw lanes 114 of FIG. 1B extends along a substantial portion of their respective lengths and widths. However, according to other embodiments, the layer of getter material may extend across only a portion of the length and/or width of the saw lane 114. In addition, the layer of getter material 108 may be disposed on one or more of the horizontal saw lanes 114 and/or one or more of the vertical saw lanes 114. According to other embodiments, the layer of getter material 108 may be discontinuous, such that one or more areas of the external region 104 that include a layer of getter material 108 may be separated from other areas that do not include a layer of getter material 108. For example, areas of the saw lane 114 that are covered by a layer of getter material 114 may be separated from each other by areas that are not covered by the layer of getter material 114. For instance, the layer of getter material may be disposed in the saw lanes 114 of the SLR region as a pattern or shape, such as an elongated oval, circle, rectangle, or square positioned within the saw lane 114.

Figure 2:
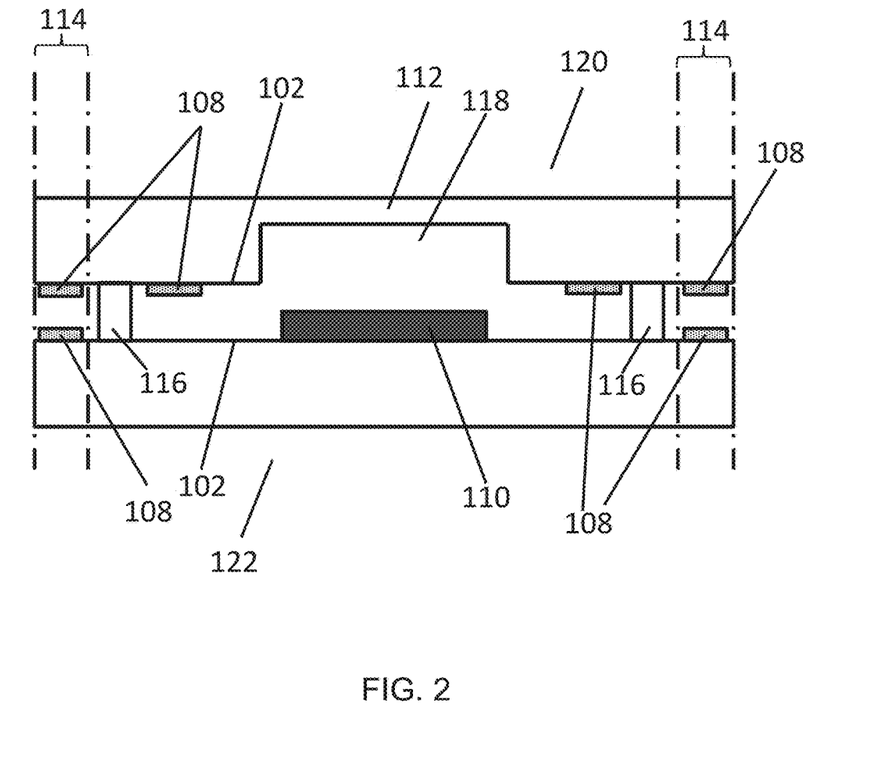
FIG. 2 is a diagram illustrating a cross-sectional view of a portion of a pair of wafers in accordance with one or more aspects of the disclosure.

FIG. 2 is a diagram illustrating a cross-sectional view of one example of a portion of a pair of wafers that are bonded and sealed to one another to form a WLP. As shown in FIG. 2, a window cap wafer 120, otherwise referred to as a lid wafer, is hermetically bonded to a device wafer 122 using bonding structures 116, which may include one or more bonding materials and/or structures, such as sealing rings and solder material, as discussed further below. The embodiment shown in FIG. 2 is shown before the dicing process, where a cutting device cuts along the saw lanes 114 to separate the individual WLP devices. The sealed cavity formed within the WLP comprises a semiconductor device 110, discussed in further detail below. According to some embodiments, the sealed cavity may be sealed under low pressure or vacuum conditions.

In accordance with certain embodiments, the window cap wafer 120 may include or otherwise be constructed from an optically transmissive window material 112 and a cavity 118 that is aligned with a semiconductor device 110 of the device wafer 122. For instance, the window cap wafer 120 may have a planar side and an opposing cavity side that includes one or more cavities 118 or recesses. The optically transmissive window material 112 may be constructed from or coated with optically transmissive material that allows one or more wavelengths of energy in the electromagnetic spectrum to pass through the window. For example, the material may be optically transmissive in the visible spectrum, the infrared (IR) spectrum, or both. Non-limiting examples of non-silicon based materials that are optically transmissive in both the visible spectrum and the IR spectrum include zinc selenide, zinc sulfide, sapphire materials, etc. According to some embodiments, the optically transmissive window material 112 may be transmissive to IR radiation. As shown in FIG. 2, a layer of getter material 108 is disposed on at least a portion of a surface 102 of the window cap wafer 120. For example, the layer of getter material 108 is disposed on at least a portion of the external region of the window cap wafer 120, including a portion of the STR region that includes the two visible saw lanes 114 that border the WLP. According to the embodiment shown in FIG. 2, the layer of getter material 108 is also disposed within the WLP region of the wafer, for instance, on the surface 102 of the window cap wafer 120 that is in proximity to the bond structure 116 and outside the cavity 118 region. As previously mentioned, this is typically where getter materials are located in the WLP devices. The embodiments disclosed herein may optionally include the getter materials disposed within the WLP package.

The device wafer 122 shown in FIG. 2 may include a semiconductor device 110 that is formed on a surface 102 of the substrate forming the device wafer 122. The semiconductor device 110 may be any kind of device, including microelectronic or sensor devices such as focal plane array (FPA) detectors and other MEMS devices. As used herein, the terms "electronic device" and "device" are used interchangeably and are to be understood to encompass semiconductor die, RF devices, MEMS devices, and other electrical components that may be used according to one or more embodiments of the present invention. In certain instances, the electronic device may include or be part of a larger system. Non-limiting examples of electronic devices also include displays and sensor arrays, including detectors and reference devices. In some embodiments, the semiconductor device may be a MEMS device comprising a sensor element. For example, the semiconductor device 110 shown in FIG. 2 may be an infrared sensor, and the optically transmissive window material 112 of the window cap wafer 120 may be made of infrared-transparent material that is aligned or otherwise oriented to be positioned over the infrared sensor such that IR light is transmitted to the device 110. As shown in FIG. 2, a layer of getter material 108 is disposed on at least a portion of the substrate 102 of the device wafer 120. Similar to the cap wafer 120 discussed above, a layer of getter material 108 is disposed on at least a portion of the external region of the device wafer 122, including the two visible saw lanes 114 bordering the exterior of the WLP. A layer of getter material 108 may also be disposed on the device wafer 122 in the region corresponding to the interior of the WLP, as discussed further below in reference to FIGS. 3B and 4B.

Although the embodiments discussed above in reference to FIG. 2 include WLPs that include a window cap wafer and device wafer, the scope of this disclosure is not limited to this specific type of WLP. For instance, other types of configurations are also possible, including WLPs that do not include a window cap wafer with transmissive properties, and may instead include opaque lids.

Figure 3A:
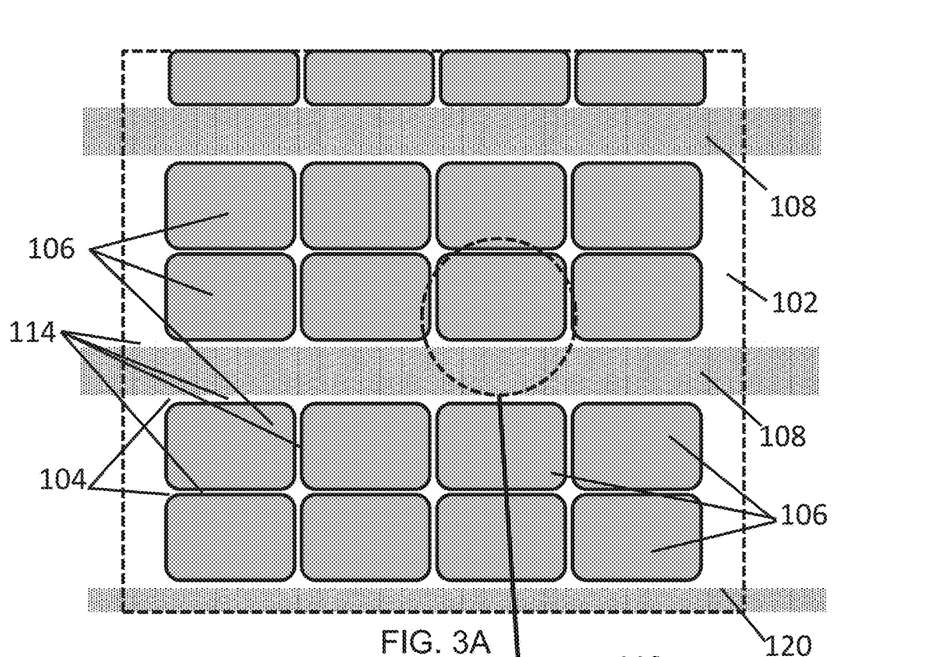
FIGS. 3A and 3B are diagrams illustrating plan views of a window cap wafer in accordance with one or more aspects of the disclosure.
Figure 3B:
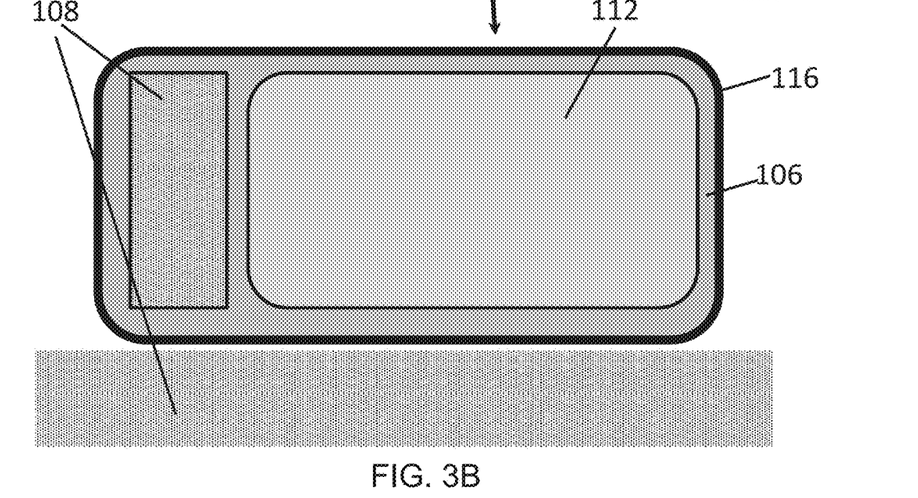

FIG. 3A illustrates a plan view of a portion of a window cap wafer 120 with a surface 102 that includes a WLP region 106 comprising a number of structures that form the lid or cap of the finished WLP. According to this example, the individual lids are arranged in multiple 4×2 group patterns that are disposed over the surface 102 of the window cap wafer 120. It will be appreciated that the group pattern is device and application-specific, and may change near the edges of the wafer, and in some instances, the grouping may not be present at all. The window cap wafer 120 also includes an external region 104 that includes a series of intersecting saw lanes 114 having different widths. For example, the 4×2 groupings of lid structures are separated by a series of wider parallel (horizontal) saw lanes 114, where at least a portion of the saw lanes 114 include a layer of getter material 108. In this embodiment, the narrower (vertical) saw lanes do not include any getter material, but in other embodiments, these areas may include such material. FIG. 3B is an enlarged portion of the window cap wafer 120 circled in FIG. 3A, and includes a WLP region 106 that corresponds to an individual lid with an optically transmissive window material 112 and a layer of getter material 108 that is disposed external to the window 112, but within the sealed cavity of the finished WLP. In some embodiments, the lid does not include this getter material. Also shown in FIG. 3B is the layer of getter material 108 disposed in the saw lane 114, as discussed above. The WLP region 106 of FIG. 3B also includes a bond structure 116 that is used to mate the window cap wafer 120 to the device wafer 122, and is discussed further below.

Figure 4A:
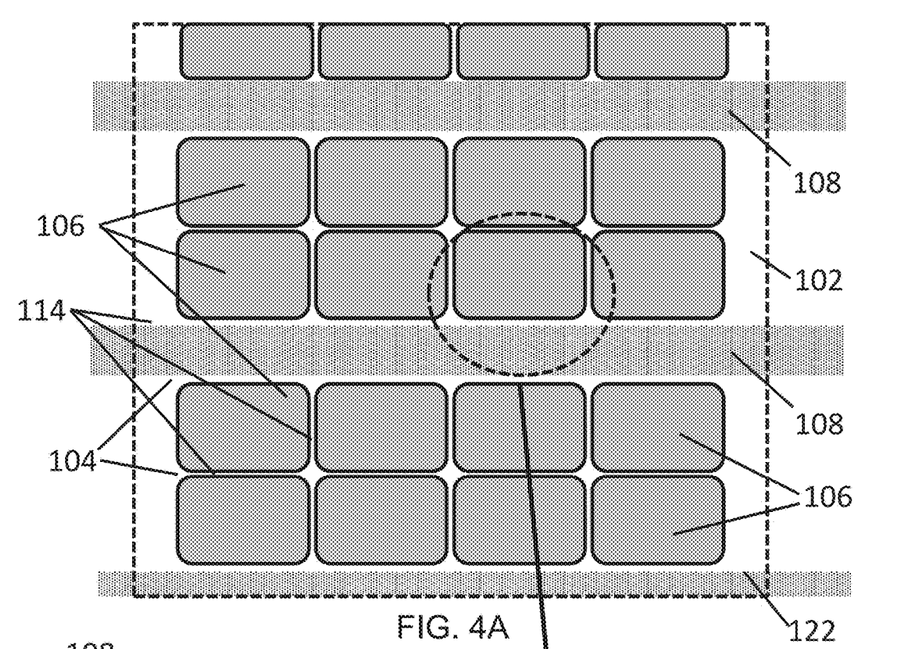
FIGS. 4A and 4B are diagrams illustrating plan views of a device wafer in accordance with one or more aspects of the disclosure.
Figure 4B:
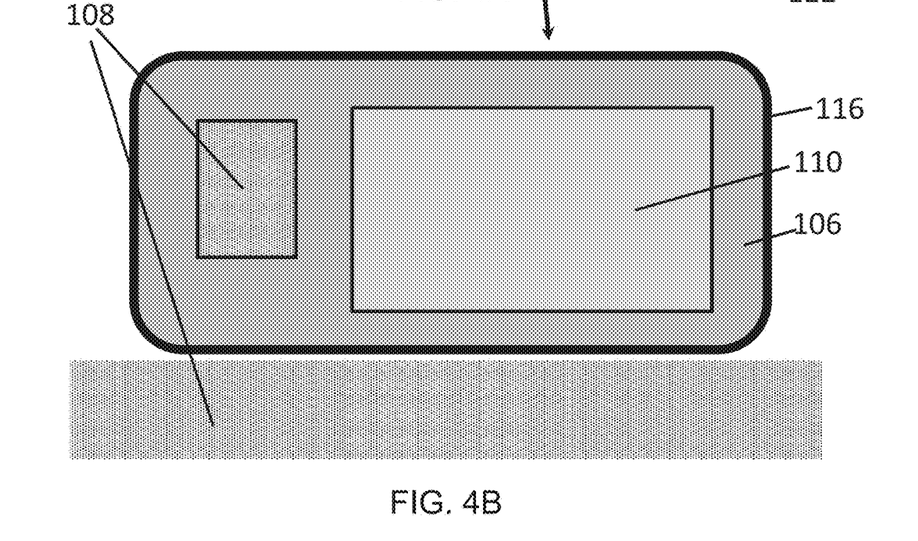

FIG. 4A illustrates a plan view of a portion of a device wafer 122 with a surface 102 that includes a WLP region 106 comprising a number of structures that form the device portion of the finished WLP, and an external region 104 that includes saw lanes 114 used to segment the wafer into individual WLPs. The WLP region 106 and external region 104 of the device wafer 122 are mirror images of the WLP and external regions of the window cap wafer 120 discussed above in reference to FIGS. 3A and 3B such that when the corresponding surfaces of the two wafers are positioned over one another, the respective bond structures 116 are aligned and form individual WLPs separated by the saw lanes. Once bonded to each other and then separated using a cutting process, the two wafers form a number of individual WLPs. As with the window cap wafer 120 discussed above, the "wider" saw lanes of the device wafer 122 also include a layer of getter material 108. FIG. 4B shows an enlarged portion of the device wafer 122 circled in FIG. 4A that includes WLP region 106 that corresponds to the device portion of the WLP. This region includes at least one semiconductor device 110, and in certain instances may include multiple semiconductor devices, including reference devices that may be included with certain types of detectors. According to this example, the WLP region 106 also includes getter material 108 that is disposed external to the semiconductor device 110 and is within the sealed cavity of the finished WLP, although in other embodiments, this getter material may not be present. Although the getter material 108 disposed within the WLP region 106 of FIG. 4B is located to one side of the semiconductor device 110, it will be appreciated that getter material can be disposed at any one or more different locations around the device 110.

As used herein, the term "getter material" refers to any material that absorbs, adsorbs, or chemically confines or reacts with one or more undesired materials, such as water, oxygen, hydrogen, organic vapor, or any combination thereof. The getter material 108 may be made of one or more materials that are highly porous and mechanically stable. According to certain embodiments, the layer of getter material comprises at least one of titanium (Ti), barium (Ba), zirconium (Zr), ruthenium (Ru), tantalum (Ta), hafnium (Hf), lanthanum (La) and molybdenum (Mo). According to some embodiments, the getter material 108 may comprise titanium. For instance, the getter material may be a titanium-based getter, such as NanoGetters® available from Integrated Sensing Systems, Inc. (Ypsilanti, Mich.). The getter material may be deposited in one or more layers, and may have a total thickness that is in a range of about 1000 Angstroms to about 10,000 Angstroms, although in some instances, the layer of getter material may have a thickness that is greater than 10,000 Angstroms. The thickness of the getter material may be any thickness that is suitable for the purposes of functioning as a getter for a specific application or device.

As discussed above, the layer of getter material 108 chemically absorbs active gases in the vacuum environment of the sealed cavity region of the WLP. For example, referring to FIGS. 3B and 4B, the getter material 108 that is disposed within the WLP region 106 may perform this function. This functionality allows the vacuum environment within the sealed cavity of the WLP to be preserved, which extends the usable life of the device. According to at least one embodiment, the layer of getter material 108 that is disposed within the external region, such as the getter material 108 formed in the saw lanes 114 of FIGS. 3A, 3B, 4A, and 4B, functions to absorb active gases during the bonding process. This reduces the load on the getter material disposed within the WLP, allowing its gettering capacity to be preserved and thus used for a longer period of time, which may possibly further extend the life of the device.

According to various embodiments, the layer of getter material 108 may be deposited on preselected regions of the wafer (i.e., the device or window cap wafer) using a masking process. For example, according to some embodiments, a masking material can be placed over the wafer to define regions of the surface of the wafer where the getter material is to be disposed. Solid portions of the mask define regions where the getter material will not be deposited, and open areas define regions where the getter material is deposited. For instance, the mask or masking material may have open regions that at least partially define an external region, where at least a portion of the external region is open to the surface of the substrate of the wafer. According to other embodiments, the mask or masking material may have open regions that correspond to regions of the wafer that are both external to the WLP region (i.e., the external region) and internal to the WLP region (i.e., the WLP region). The getter material may thus be deposited on at least a portion of the external region and at least a portion of the WLP region, such as the embodiment discussed further below in reference to FIGS. 5A and 5B.

Figure 5A:
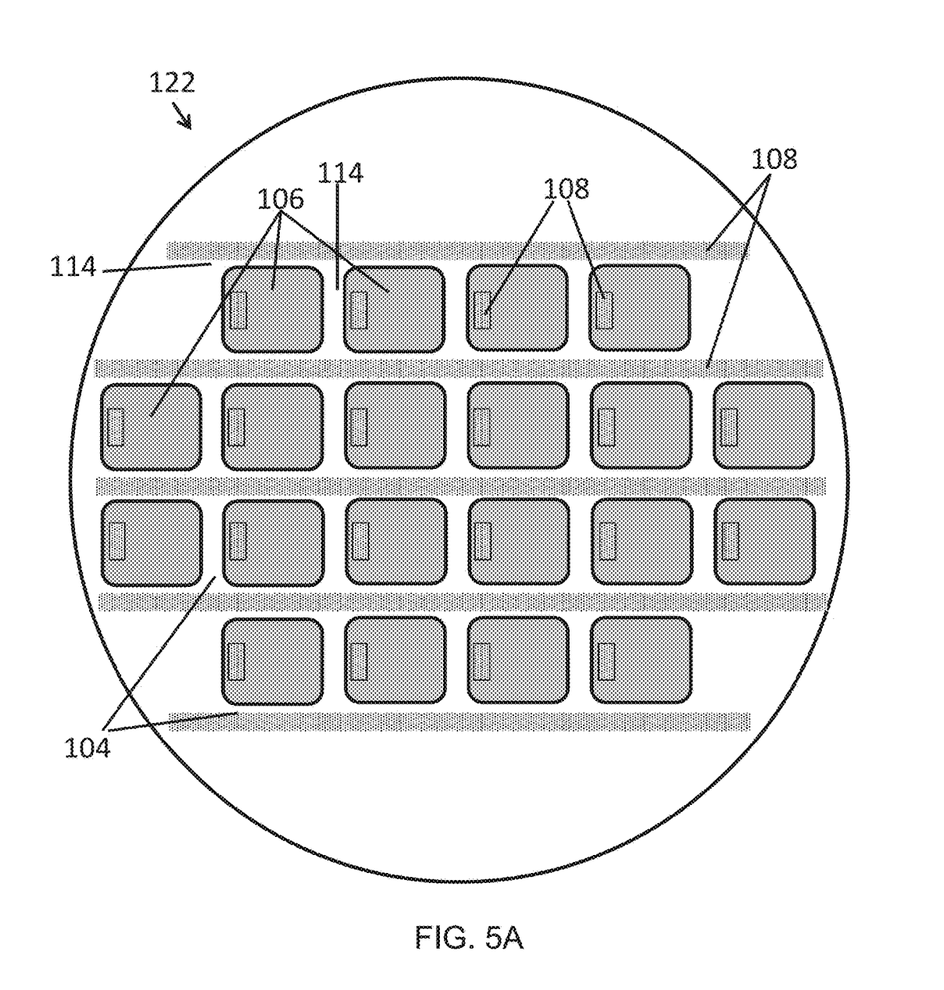
FIG. 5A is a diagram illustrating a plan view of another device wafer in accordance with one or more aspects of the disclosure.

FIG. 5A is a plan view of a device wafer 122 that has a pattern for the WLP region 106, wherein, in contrast to the layout shown in FIG. 4A, the WLP devices in this example are evenly distributed across the surface of the wafer and are separated by a series of intersecting saw lanes 114 that form an STR region that is part of the external region 104 of the surface of the wafer. At least a portion of the WLP region 106 includes a layer of getter material 108, and at least a portion of the external region 104 includes a layer of getter material 108, which in this instance also includes the horizontally-oriented saw lanes 114.

Figure 5B:
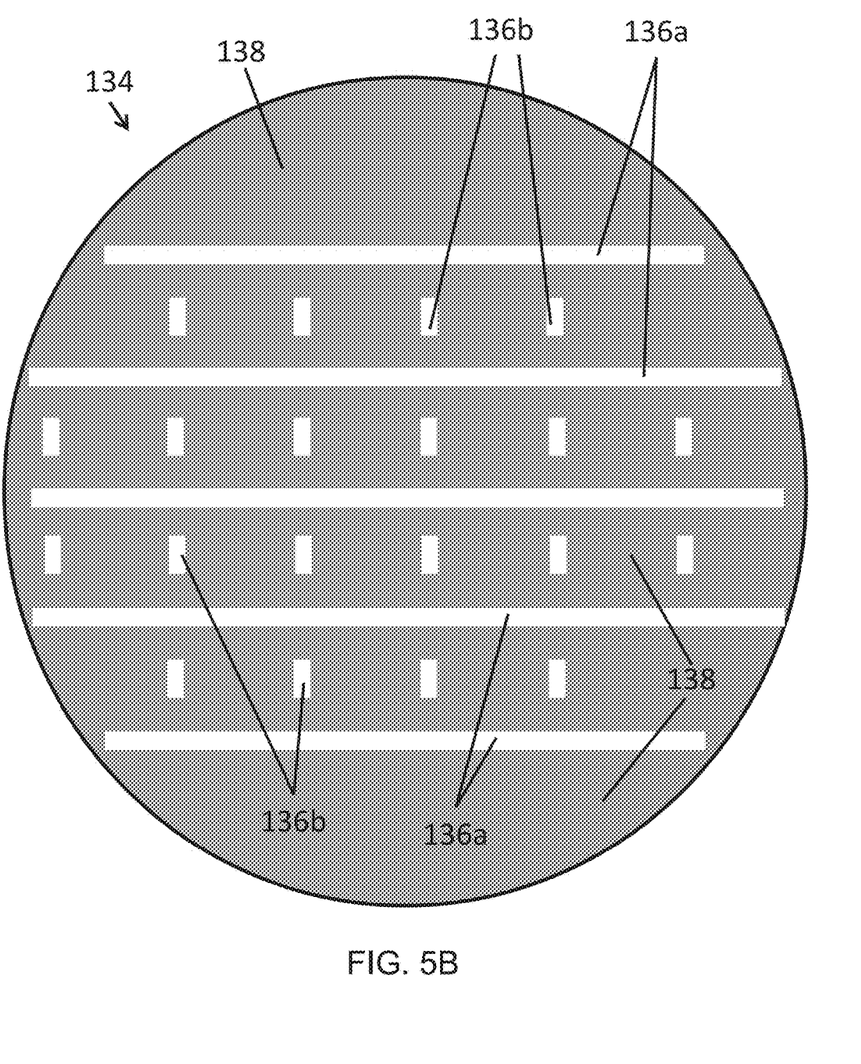
FIG. 5B is a diagram of a mask corresponding to the device wafer shown in FIG. 5A in accordance with one or more aspects of the disclosure.

FIG. 5B is an illustration of a mask 134 that corresponds to the layout presented in FIG. 5A and includes a solid or otherwise blocking region 138 that blocks the deposition of getter material. The mask 134 also includes open regions 136a and 136b that correspond to the desired pattern for the layer of getter material 108. For example, open region 136a corresponds to the portion of the external region where getter material is deposited, and open region 136b corresponds to a portion of the WLP region where getter material is deposited. As will be appreciated, a separate mask with the same or a different pattern may be constructed and provided for the corresponding window cap wafer that is to be bonded to the device wafer. For instance, getter material may be deposited in the same corresponding portions of the external regions 104 and WLP regions of the device and window cap wafer. This allows for the same mask to be used for both types of wafers, which may increase process efficiency and reduce manufacturing costs.

The mask may be a separate piece, or may be deposited onto the surface of the wafer. For example, according to some embodiments, the mask may be a shadow mask, which refers to a planar material that includes the predetermined pattern of holes through which deposition occurs. The shadow mask may be a thin metal plate of any shape or size with holes or openings of any shape or size that define the desired pattern. For instance, the mask 134 shown in FIG. 5B has the general outer outline of the underlying device wafer 122, and the interior includes open regions 136a and 136b that correspond to the desired pattern for the getter material, which in this instance includes a portion of the WLP region and a substantial portion of the horizontal saw lanes 114 that comprise the external region. The mask may be constructed from stainless steel or other materials of the stainless steel family, such as Kovar® (Carpenter Technology Corp., Wyomissig, Pa.). The mask may be aligned and placed over the device or lid wafer so that during the deposition process, the getter material is deposited through the open areas of the mask onto the underlying surface of the wafer.

According to other embodiments, the mask may be a photoresist mask that is applied to the surface of the wafer to define the desired pattern for the getter material. For example, photoresist material may be deposited onto certain regions of the wafer to block the deposition of getter material and getter material may then be deposited onto the surface of the wafer where there is no photoresist material. A coating material may also be deposited to cover the getter material and protect it during a later processing step where the photoresist material is removed. When activated, the coating material may be absorbed into the bulk of the getter material, leaving "fresh" getter material exposed. According to some embodiments, the coating material may comprise one or more layers of metal, such as nickel, copper, gold, or platinum. The coating material may be any material that does not readily oxidize and is capable of diffusing into the getter material at relatively low temperatures, i.e., 300° C. The coating material must also be compatible with the systems and processes of the desired application, such as the desired deposition method and system, and the photolithography material and system. The thickness of the layer of coating material may be thin, and in certain embodiments may have a thickness of less than 100 nm, and according to at least one embodiment, may have a thickness of about 30 nm.

According to some embodiments, the layer of getter material 108 may be deposited onto the substrates of the device wafer 122 and window cap wafer 120 using a sputtering, e-beam, or, in certain instances, thermal evaporation methods. For example, a sputtering source may be used for a high-energy deposition process, and electron beam and thermal evaporation sources may be used for low-energy deposition processes. High-energy deposition methods may create a layer of getter material with a relatively flat morphology, whereas low-energy deposition methods may create a layer of getter material with a more nodular or agglomerated morphology. In certain instances, a rough, nodular structure may function to physically entrap gas molecules and therefore improve the gettering capacity of the getter material.

In accordance with some embodiments, the layer of getter material is activated during the deposition process itself, but in other embodiments, the layer of getter material 108 is activated separately, such as during the bonding process, as discussed below. Activating refers to any process that may be performed on the getter material that allows it to function as a getter material, and typically includes heating the getter material at a predetermined temperature for a predetermined length of time. For example, in certain embodiments, the getter material may be activated by heating the getter material in an inert or vacuum environment to a temperature in a range of about 200° C. to about 500° C. for a period of time in a range of about 10 minutes to about 120 minutes. According to some embodiments, the getter material is a non-evaporable getter. This type of getter may be deposited using a sputtering technique performed at high or ultra-high vacuum at low temperatures and may be activated by heating the getter material to temperatures less than 350 C.°. This type of getter material is especially useful for applications where the WLP region includes devices, such as a microbolometer device, where it is desired to keep the maximum temperature experienced by the device to values below 350° C.

In certain instances, the getter material 108 may be deposited before or after the deposition of one or more layers of material that form the bonding structure 116. For example, the bonding structure 116 may include a seal structure comprising one or more layers of metal and/or dielectrics that form a continuous ring around the perimeter of the WLP. The seal structure can comprise multiple layers of different metals, including one or more of titanium tungsten (TiW), titanium (Ti), platinum (Pt), nickel (Ni), and gold (Au) that are deposited on one or both of the device and lid wafer around the perimeter of the WLP. Seal structures are typically formed on each of the lid and device wafers. The bonding structure also includes a bonding agent, such as heat activated solder, e.g., gold-tin solder or solder materials that include indium that can be used to bond the respective sealing structures on each of the wafers to one another. In certain instances, the seal structure may include a layer of material that functions as an adhesion surface for the bonding agent. According to some embodiments, the bonding agent may be comprised of a heat activated solder, but the bonding agent may comprise any appropriate sealing material. For example, according to some embodiments, the bonding structure 116 may comprise a compression seal, such as an indium compression seal. If a compression seal is used, then the seal structure may not include a layer of material that functions as the adhesion surface for a heat activated bonding agent. According to some embodiments, the bonding agent is applied to each of the seal structures on the lid and device wafers, at which point the two wafers are ready for the bonding process, as discussed below.

According to one embodiment, after the getter material is deposited, the window cap wafer 120 and device wafer 122 may be moved to an assembly chamber where the getter activation and bonding process takes place. During this process, the window cap wafer 120 may be aligned and affixed to the device wafer 120 by a technique that produces a vacuum-tight seal as well as a mechanical bond. One suitable example of such a process is hybridization. In hybridization, two articles to be joined and sealed are aligned and contacted together, under mechanical pressure and heating, with a sealing element surface, typically made of metal such as indium, disposed therebetween. In hybridization, an entire article may be made of the sealing material, a separate sealing element may be disposed between the articles, or one or more of the article surfaces to be sealed may be coated with the sealing material. The application of mechanical force to the articles and through the sealing material at elevated temperatures causes the sealing material to form a joint and hermetic seal between the articles. For instance, using the example from above, each of the window cap wafer and the device wafer may include a seal structure with a layer of indium as the bonding agent disposed on one or both of the respective sealing structures. When exposed to heat, the bonding agent melts, and in combination with the applied pressure, a sealed bond is formed between the two wafers. The applied heat may also function to activate the getter. The bonding and activation process may be performed in an inert or vacuum atmosphere provided by the assembly chamber. This reduces the risk of contamination of the device and the getter material and ensures that the getter material can be activated properly. Once the bonding agent has cooled and re-solidified, the bonding process is complete.

According to some embodiments, the interior of the WLP is sealed at a vacuum pressure of the interior of the assembly chamber so that the getter material is not exposed to the atmosphere. In embodiments where a heat activated bonding agent is used, the bonding structures (e.g., the seal structure with the bonding agent) of each wafer are aligned with one another and then brought into contact with each other in the vacuum or low pressure environment under heated conditions and applied pressure. For example, during the bonding process, the temperature within the assembly chamber may be in a range of about 300-350° C. In accordance with some embodiments, the temperature used during the bonding process is also suitable for activating the getter material. Thus, the getter material does not have to be activated in a separate processing step.

During the bonding process, the getter material 108 disposed in the external region 104 of the window cap wafer 120 and/or device wafer 122 functions as an extra vacuum "pump" in the vicinity of the bond structure 116 and thus removes material outgassed by components on the wafer, such as trapped gases in the bonding agent, materials on the window cap wafer 120 and/or materials on the device wafer 122. The layer of getter material thus also reduces pressure in the region between the window cap wafer and the device wafer during the bonding process. As noted above, this extra gettering capacity may reduce the load on the getter material disposed within the WLP region of the window cap wafer 120 and/or device wafer 122. According to some embodiments, the getter material disposed in the external region is sufficient to remove contaminants during the bonding process such that the sealed cavity within the WLP does not need a separate getter material. This may allow for smaller die sizes, and may also reduce manufacturing costs. Once the WLP is sealed, the external getter material is no longer needed and may be removed or otherwise destroyed, such as during the dicing process.

Figure 6:
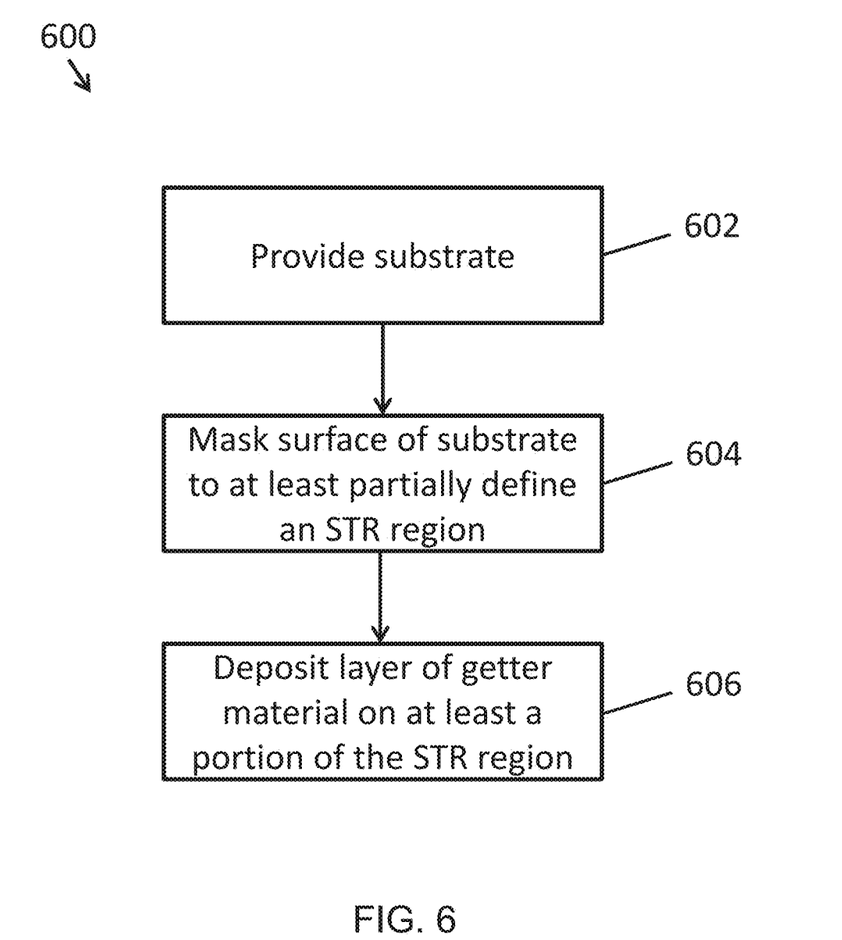
FIG. 6 is a flow diagram of one method in accordance with one or more aspects of the disclosure.

According to at least one embodiment, a method for forming a wafer is disclosed that includes depositing a layer of getter material onto at least a portion of a substrate of the wafer that corresponds to the external region using a masking process. Referring to FIG. 6, in at least one embodiment, the method 600 comprises providing a substrate (step 602). For instance, the substrate may be a window cap wafer 120 or a device wafer 122 as discussed above. The method 600 may then comprise masking a surface of the substrate with a masking material to at least partially define an external region, such that at least a portion of the external region is open to the surface of the substrate (step 604). In some embodiments, the mask may also at least partially define a WLP region, such that at least a portion of the WLP region is also open to the surface of the substrate (see dashed box 604a). According to some embodiments, step 604 may be accomplished using a shadow mask as discussed above, where a shadow mask is first positioned over a surface of the window cap wafer and/or device wafer. Referring to the embodiment shown in FIG. 2, the shadow mask may be positioned over the cavity side of the window cap wafer 120 and the device side of the device wafer 122. Openings in the mask correspond to and define at least a portion of the external region of the window cap wafer 120 and/or device wafer 122, and according to some embodiments, the openings in the mask also correspond to at least a portion of the WLP region of the window cap wafer 120 and/or device wafer. The method 600 may further comprise depositing (step 606) a layer of getter material through the shadow mask onto the underlying substrate of the cap wafer and/or device wafer. As a result, at least a portion of the external region (and in some example at least a portion of the WLP region) of one or both of the device and lid wafer is covered by a layer of getter material.

Figure 7:
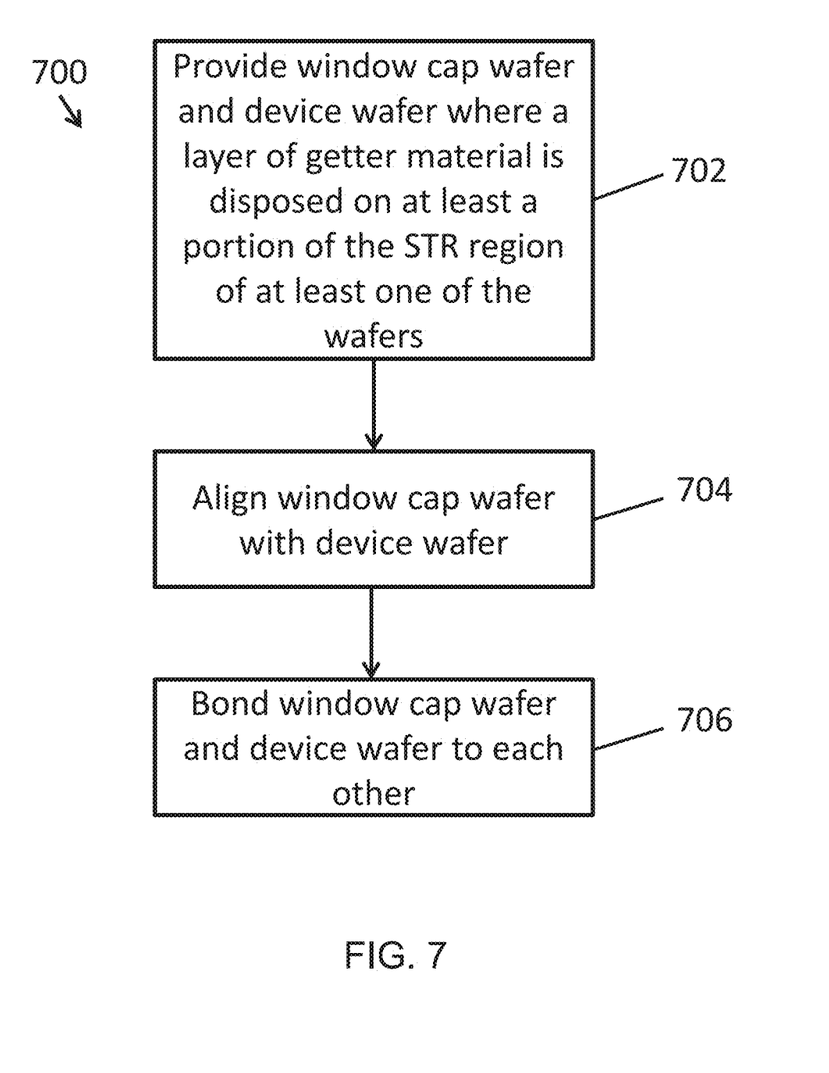
FIG. 7 is a flow diagram of another method in accordance with one or more aspects of the disclosure.

According to another embodiment, a method for forming a wafer level package is disclosed that includes bonding a window cap wafer to a device wafer, where at least one of the wafers includes a layer of getter material in at least a portion of the external region of the wafer. Referring to FIG. 7, in at least one embodiment, the method 700 comprises providing a window cap wafer and a device wafer (step 702), where each of the window cap wafer and the device wafer have a surface defined by an external region and a WLP region. A layer of getter material is disposed on at least a portion of the external region of at least one of the window cap wafer and the device wafer. For example, a layer of getter material may be disposed on at least a portion of one or more saw lanes that comprise the external region. As discussed above, the layer of getter material disposed in the external region may be obtained via a masking and deposition process. The method 700 further comprises aligning the window cap wafer with the device wafer (step 704). For example, as discussed above, this step may be accomplished by aligning the bonding structures of each of the respective devices to one another. Aligning may also allow for the respective external regions of each of the device wafer and the window cap wafer to be aligned with each other. The method 700 may further comprise bonding (step 706) the window cap wafer and the device wafer to each other to form the finished wafer level package. For example, as discussed above, the bonding process may be performed under vacuum or low pressure conditions and may include applying pressure to the aligned wafers while heating the bonding material(s). In some embodiments, the heating temperature used during the bonding process is sufficient to activate the getter material.

Processes 600 and 700 each depict one particular sequence of acts in a particular embodiment. Depending on the application, some acts are optional and, as such, may be omitted in accord with one or more embodiments, and in some instances, additional acts may be added. For example, method 700 may further include separating the individual WLPs from one another using a dicing process. Additionally, the order of acts can be altered, or other acts can be added, without departing from the scope of the embodiments described herein. For instance, the getter material may be activated before the bonding process, and/or may be deposited on the wafer before, during, or after layers of the bonding structure are deposited on the wafers.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A wafer for use in forming a wafer level package comprising:
    a substrate having a seal structure formed on a portion of a surface of the substrate, the surface defined by a wafer level package (WLP) region and an external region, the seal structure forming a perimeter of the WLP region; and
    a layer of getter material disposed on at least a portion of the external region of the surface of the substrate and outside the seal structure and the WLP region.

2. The wafer of claim 1, wherein the external region comprises a saw-to-reveal (STR) region.

3. The wafer of claim 2, wherein the STR region is defined by a two-dimensional pattern of intersecting horizontal and vertical saw lanes, and the layer of getter material is disposed on at least a portion of at least one of the horizontal and vertical saw lanes.

4. The wafer of claim 3, wherein the layer of getter material is disposed on at least a portion of both the horizontal and the vertical saw lanes.

5. The wafer of claim 2, wherein the STR region is defined by a series of parallel saw lanes.

6. The wafer of claim 2, wherein the layer of getter material is continuous.

7. The wafer of claim 1, wherein the substrate is a window cap wafer and at least a portion of the WLP region includes an optically transmissive window material.

8. The wafer of claim 1, wherein the substrate is a device wafer and at least a portion of the WLP region includes at least one semiconductor device.

9. The wafer of claim 1, wherein the layer of getter material is further disposed inside the seal structure and the WLP region on at least a portion of the WLP region.

10. The wafer of claim 1, wherein the getter material comprises at least one of titanium (Ti), zirconium (Zr), ruthenium (Ru), tantalum (Ta), hafnium (Hf), lanthanum (La) and molybdenum (Mo).

11. The wafer of claim 10, wherein the thickness of the layer of getter material is in a range of about 1000 Angstroms to about 10,000 Angstroms.

12. A method for forming a wafer comprising:
    providing a substrate;
    masking a surface of the substrate with a masking material to at least partially define an external region, wherein at least a portion of the external region is open to the surface of the substrate; and
    depositing a layer of getter material on the surface of the substrate through the open portion of the external region.

13. The method of claim 12, wherein masking the surface with the masking material at least partially defines a WLP region separated from the external region, wherein at least a portion of the WLP region is open to the surface of the substrate, and the layer of getter material is further deposited on the surface of the substrate through the open portion of the WLP region.

14. The method of claim 12, wherein the external region comprises an STR region defined by at least one saw lane.

15. The method of claim 14, wherein depositing forms a continuous layer of getter material.

16. A method for forming a wafer level package, comprising:
    providing a window cap wafer and a device wafer, each of the window cap wafer and the device wafer having a seal structure formed on a portion of a surface of the substrate, the substrate defined by a WLP region and an external region, the seal structure forming a perimeter of the WLP region, wherein a layer of getter material is disposed on at least a portion of the external region and outside the seal structure and the WLP region of at least one of the window cap wafer and the device wafer;
    aligning the window cap wafer with the device wafer; and
    bonding the window cap wafer and the device wafer to each other to form the wafer level package.

17. The method of claim 16, wherein during the bonding at least a portion of one or more impurities present on at least one of the window cap wafer and the device wafer outgas into the layer of getter material.

18. The method of claim 16, wherein the layer of getter material reduces pressure in a region between the window cap wafer and the device wafer during the bonding.

19. The method of claim 16, wherein the bonding is performed under vacuum and comprises heating the layer of getter material to a temperature such that it is activated during bonding.

20. The method of claim 19, wherein the layer of getter material is heated to a temperature of at least 300° C.

* * * * *